US011816905B2

(12) United States Patent
Kasarla et al.

(10) Patent No.: US 11,816,905 B2
(45) Date of Patent: Nov. 14, 2023

(54) MULTI-CAMERA VISION SYSTEM INTEGRATED INTO INTERIOR REARVIEW MIRROR

(71) Applicant: Magna Electronics Inc., Auburn Hills, MI (US)

(72) Inventors: Nagender Reddy Kasarla, New Hudson, MI (US); Sujith Gurram, Orion Township, MI (US); Suresh Boddi, New Hudson, MI (US)

(73) Assignee: Magna Electronics Inc., Auburn Hills, MI (US)

( * ) Notice: Subject to any disclaimer, the term of this patent is extended or adjusted under 35 U.S.C. 154(b) by 70 days.

(21) Appl. No.: 17/249,937

(22) Filed: Mar. 19, 2021

(65) Prior Publication Data

US 2021/0291739 A1    Sep. 23, 2021

Related U.S. Application Data

(60) Provisional application No. 62/705,679, filed on Jul. 10, 2020, provisional application No. 63/000,518, (Continued)

(51) Int. Cl.
*G06V 20/69* (2022.01)
*B60R 1/12* (2006.01)
(Continued)

(52) U.S. Cl.
CPC ............ *G06V 20/69* (2022.01); *B60R 1/04* (2013.01); *B60R 1/12* (2013.01); *B60R 11/00* (2013.01);
(Continued)

(58) Field of Classification Search
CPC .. B60R 1/04; B60R 1/12; B60R 11/00; B60R 1/06; B60R 2001/1215; B60R 2300/8006; B60R 2300/8013; B60R 2300/802; B60R 2300/804; B60R 2300/8033; B60R 2300/8026; B60R 2300/8066; B60R 2001/1253; B60R 2300/205;
(Continued)

(56) References Cited

U.S. PATENT DOCUMENTS 5,550,677 A   8/1996 Schofield et al.
5,670,935 A   9/1997 Schofield et al.
(Continued)

*Primary Examiner* — Nathnael Aynalem
(74) *Attorney, Agent, or Firm* — HONIGMAN LLP

(57) ABSTRACT

A vehicular vision system includes an electronic control unit (ECU) disposed at an interior rearview mirror assembly of a vehicle equipped with the vehicular vision system that includes electronic circuitry and associated software, a driver monitoring camera disposed at the interior rearview mirror assembly and having a field of view of a driver region in a cabin of the vehicle, and an occupant monitoring camera disposed at the interior rearview mirror assembly and having a field of view of an occupant region in the cabin of the vehicle. The electronic circuitry of the ECU includes an image processor operable to process image data captured by the driver monitoring camera and the occupant monitoring camera. The ECU, via processing at the ECU of image data captured by the driver monitoring camera, determines attentiveness of a driver of the vehicle.

16 Claims, 16 Drawing Sheets

Related U.S. Application Data filed on Mar. 27, 2020, provisional application No. 62/991,866, filed on Mar. 19, 2020, provisional application No. 62/991,609, filed on Mar. 19, 2020.

(51) Int. Cl.

| | | |
|---|---|---|
| *B60R 1/04* | (2006.01) | |
| *B60R 11/00* | (2006.01) | |
| *B60W 40/08* | (2012.01) | |
| *G06V 20/59* | (2022.01) | |
| *H04N 23/52* | (2023.01) | |
| *G06V 10/764* | (2022.01) | |
| *G06V 10/82* | (2022.01) | |

(52) U.S. Cl.
CPC .......... *B60W 40/08* (2013.01); *G06V 10/764* (2022.01); *G06V 10/82* (2022.01); *G06V 20/597* (2022.01); *H04N 23/52* (2023.01); *B60R 2001/1215* (2013.01); *B60R 2001/1253* (2013.01); *B60R 2011/0026* (2013.01); *B60R 2300/103* (2013.01); *B60R 2300/8006* (2013.01); *B60W 2540/221* (2020.02); *B60W 2540/229* (2020.02)

(58) Field of Classification Search
CPC ........ B60R 2300/202; B60R 2300/207; B60R 2300/103; B60R 2300/106; B60R 1/29; B60R 1/30; B60R 2011/0003; G06V 20/593; G06V 20/597; G06V 20/59; G06K 9/627; G02B 27/01; G02B 27/0093; G05B 2219/35503; G06F 3/012; G06F 3/013; B60K 2370/194; B60K 2370/736; B60K 2370/739; B60K 2370/741
USPC ........................................................ 348/148
See application file for complete search history.

(56) References Cited

U.S. PATENT DOCUMENTS

| | | |
|---|---|---|
| 5,949,331 A | 9/1999 | Schofield et al. |
| 6,097,023 A | 8/2000 | Schofield et al. |
| 6,690,268 B2 | 2/2004 | Schofield et al. |
| 6,824,281 B2 | 11/2004 | Schofield et al. |
| 7,038,577 B2 | 5/2006 | Pawlicki et al. |
| 7,262,406 B2 | 8/2007 | Heslin et al. |
| 7,265,342 B2 | 9/2007 | Heslin et al. |
| 7,274,501 B2* | 9/2007 | McCabe ................ G02F 1/157 359/245 |
| 7,339,149 B1 | 3/2008 | Schofield et al. |
| 7,344,261 B2 | 3/2008 | Schofield et al. |
| 7,420,159 B2 | 9/2008 | Heslin et al. |
| 7,423,248 B2 | 9/2008 | Schofield et al. |
| 7,459,664 B2 | 12/2008 | Schofield et al. |
| 7,480,149 B2 | 1/2009 | DeWard et al. |
| 7,533,998 B2 | 5/2009 | Schofield et al. |
| 7,538,316 B2 | 5/2009 | Heslin et al. |
| 7,655,894 B2 | 2/2010 | Schofield et al. |
| 7,720,580 B2 | 5/2010 | Higgins-Luthman |
| 7,855,755 B2 | 12/2010 | Weller et al. |
| 7,914,187 B2 | 3/2011 | Higgins-Luthman et al. |
| 7,916,009 B2 | 3/2011 | Schofield et al. |
| 7,994,462 B2 | 8/2011 | Schofield et al. |
| 8,179,437 B2 | 5/2012 | Schofield et al. |
| 8,203,440 B2 | 6/2012 | Schofield et al. |
| 8,222,588 B2 | 7/2012 | Schofield et al. |
| 8,239,086 B2 | 8/2012 | Higgins-Luthman |
| 8,256,821 B2 | 9/2012 | Lawlor et al. |
| 8,289,142 B2 | 10/2012 | Pawlicki et al. |
| 8,314,689 B2 | 11/2012 | Schofield et al. |
| 8,324,552 B2 | 12/2012 | Schofield et al. |
| 8,405,726 B2 | 3/2013 | Schofield et al. |
| 9,405,120 B2 | 8/2016 | Graf et al. |
| 9,487,159 B2 | 11/2016 | Achenbach |
| 9,596,387 B2 | 3/2017 | Achenbach et al. |
| 9,871,971 B2 | 1/2018 | Wang et al. |
| 9,896,039 B2 | 2/2018 | Achenbach et al. |
| 10,017,114 B2 | 7/2018 | Bongwald |
| 10,065,574 B2 | 9/2018 | Tiryaki |
| 10,850,693 B1* | 12/2020 | Pertsel ................ G05D 1/0088 |
| 11,242,008 B2 | 2/2022 | Blank et al. |
| 2009/0243824 A1* | 10/2009 | Peterson ............ G06F 3/04886 348/148 |
| 2009/0295181 A1 | 12/2009 | Lawlor et al. |
| 2014/0160284 A1 | 6/2014 | Achenbach et al. |
| 2014/0226012 A1 | 8/2014 | Achenbach |
| 2014/0336876 A1 | 11/2014 | Gieseke et al. |
| 2015/0009010 A1 | 1/2015 | Biemer |
| 2015/0015710 A1 | 1/2015 | Tiryaki |
| 2015/0015713 A1 | 1/2015 | Wang et al. |
| 2015/0022664 A1 | 1/2015 | Pflug et al. |
| 2015/0092042 A1 | 4/2015 | Fursich |
| 2015/0294169 A1 | 10/2015 | Zhou et al. |
| 2015/0296135 A1 | 10/2015 | Wacquant et al. |
| 2015/0327398 A1 | 11/2015 | Achenbach et al. |
| 2015/0352953 A1 | 12/2015 | Koravadi |
| 2016/0137126 A1 | 5/2016 | Fursich et al. |
| 2016/0209647 A1 | 7/2016 | Fursich |
| 2017/0217367 A1 | 8/2017 | Pflug et al. |
| 2017/0240022 A1* | 8/2017 | Ireri ........................ A61B 5/01 |
| 2017/0274906 A1 | 9/2017 | Hassan et al. |
| 2017/0349099 A1* | 12/2017 | Kunze ................ G02B 27/0101 |
| 2018/0099612 A1* | 4/2018 | Weller ................ H04N 5/2254 |
| 2018/0244129 A1* | 8/2018 | Whitens ................ G01J 5/0037 |
| 2019/0176837 A1* | 6/2019 | Williams ............... B60W 40/08 |
| 2020/0143560 A1 | 5/2020 | Lu et al. |
| 2020/0202151 A1 | 6/2020 | Wacquant |
| 2020/0296273 A1 | 9/2020 | Staab et al. |
| 2020/0353868 A1* | 11/2020 | Schut ........................ B60R 1/04 |
| 2021/0114439 A1 | 4/2021 | Moschek et al. |
| 2021/0323473 A1 | 10/2021 | Peterson et al. |
| 2022/0242438 A1 | 8/2022 | Sobecki et al. |
| 2022/0254132 A1 | 8/2022 | Rother |

\* cited by examiner

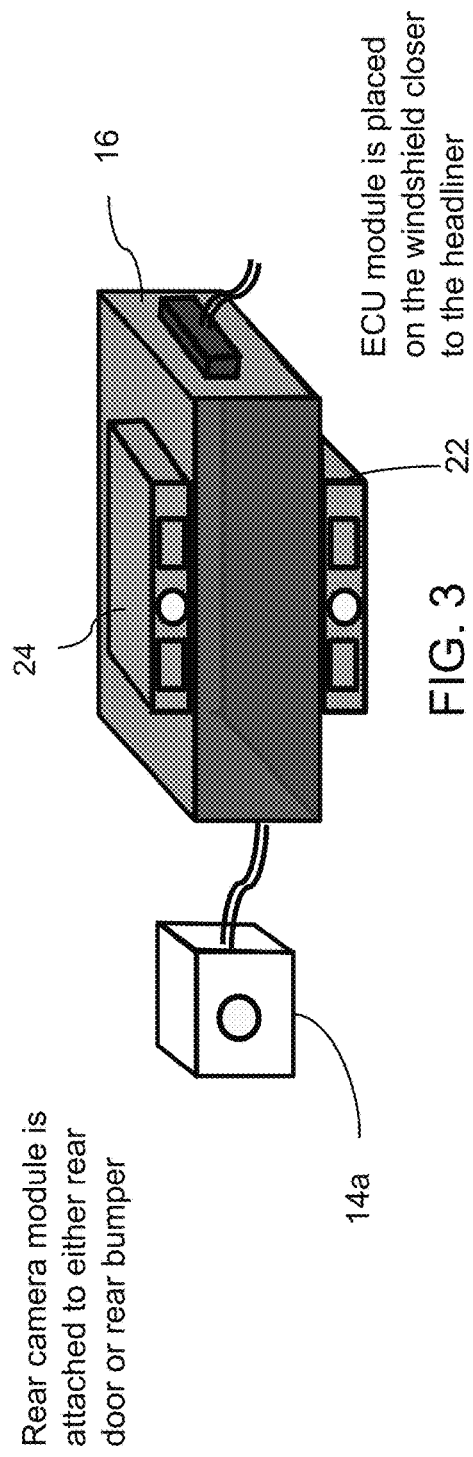
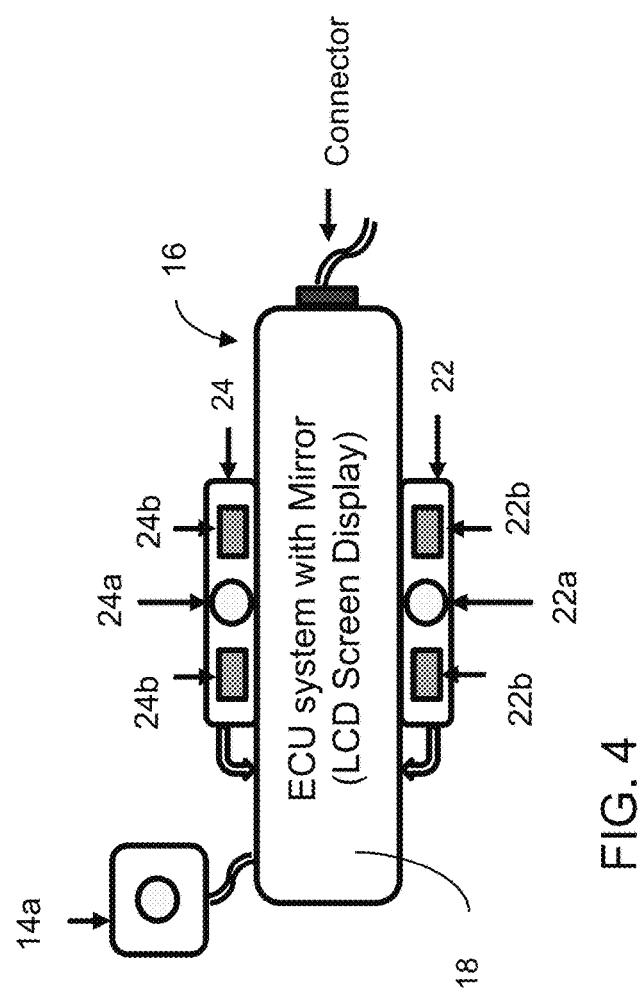
FIG. 3
FIG. 4

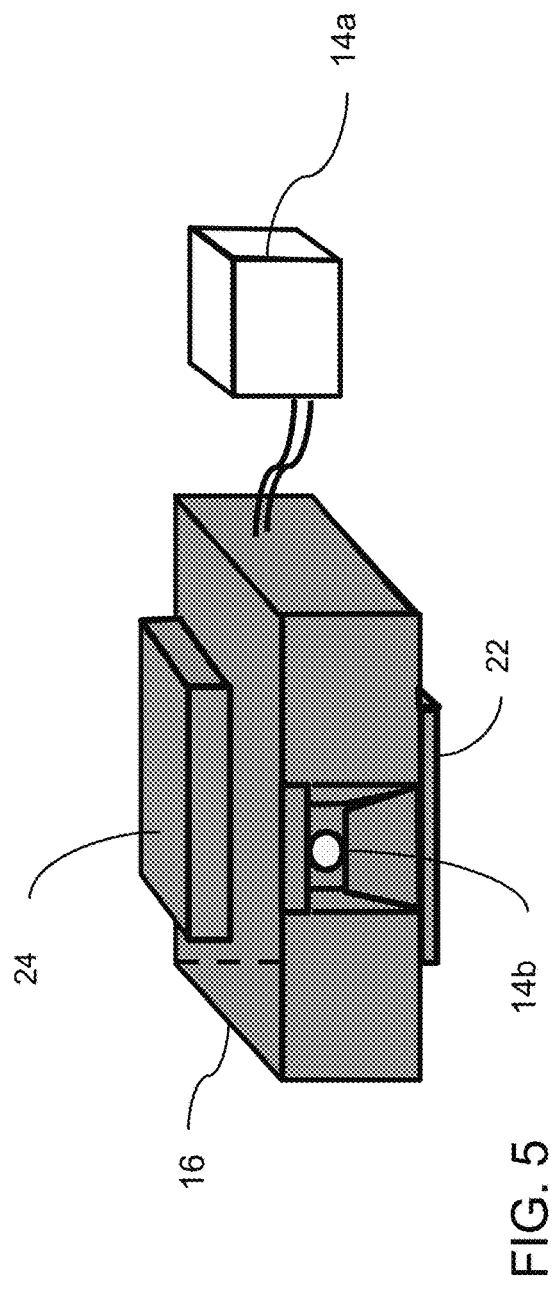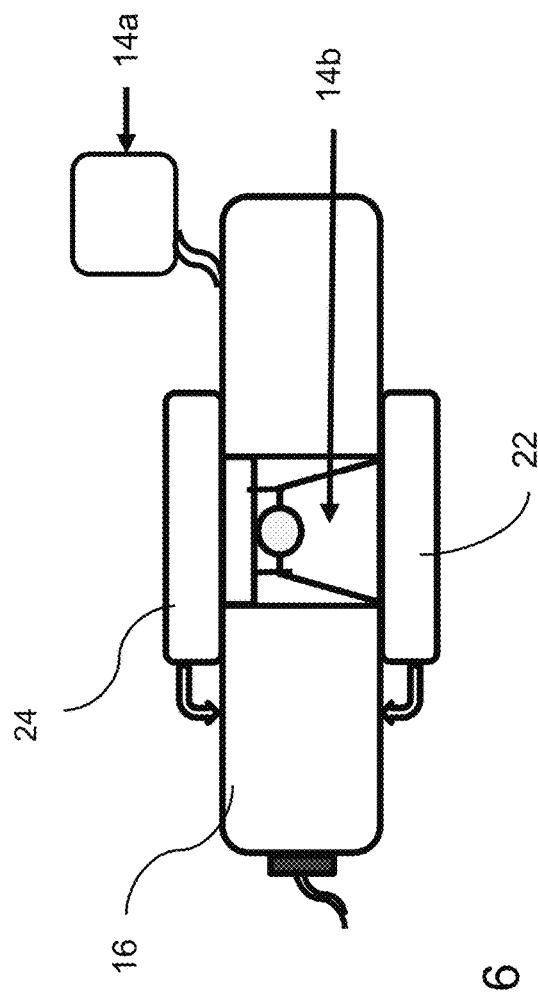
FIG. 5
FIG. 6

Electrochromic device with transparent redox electrolyte in bleached (left) and coloured state (right).

MULTI-CAMERA VISION SYSTEM INTEGRATED INTO INTERIOR REARVIEW MIRROR

CROSS REFERENCE TO RELATED APPLICATIONS

The present application claims the filing benefits of U.S. provisional application Ser. No. 62/705,679, filed Jul. 10, 2020, U.S. provisional application Ser. No. 63/000,518, filed Mar. 27, 2020, U.S. provisional application Ser. No. 62/991,866, filed Mar. 19, 2020, and U.S. provisional application Ser. No. 62/991,609, filed Mar. 19, 2020, which are hereby incorporated herein by reference in their entireties.

FIELD OF THE INVENTION

The present invention relates generally to a vehicle vision system for a vehicle and, more particularly, to a vehicle vision system that utilizes one or more cameras at a vehicle.

BACKGROUND OF THE INVENTION

Use of imaging sensors in vehicle imaging systems, such as for machine vision applications in vehicles, is known. Packaging of forward facing imagers is also known, such as described in U.S. Pat. Nos. 7,262,406; 7,265,342; 7,420,159; 7,480,149; 7,533,998; 7,538,316; 7,916,009; 8,179,437 and 8,405,726, which are hereby incorporated herein by reference in their entireties. Examples of known vision systems are described in U.S. Pat. Nos. 8,324,552; 8,314,689; 8,289,142; 8,222,588; 8,239,086; 8,203,440; 7,994,462; 7,655,894; 7,339,149; 7,344,261; 7,459,664; 7,423,248; 6,097,023; 5,949,331; 5,670,935 and 5,550,677, which are hereby incorporated herein by reference in their entireties.

SUMMARY OF THE INVENTION

The present invention provides a vehicular vision system that includes an electronic control unit (ECU) disposed at an interior rearview mirror assembly of a vehicle equipped with the vehicular vision system. The ECU includes electronic circuitry and associated software. The system also includes a driver monitoring camera disposed at the interior rearview mirror assembly and having a field of view of a driver region in a cabin of the vehicle. The image data captured by the driver monitoring camera is provided to the ECU. They system also includes an occupant monitoring camera disposed at the interior rearview mirror assembly and having a field of view of an occupant region in the cabin of the vehicle. The image data captured by the occupant monitoring camera is also provided to the ECU. The electronic circuitry of the ECU includes an image processor operable to process image data captured by the driver monitoring camera and the occupant monitoring camera and the ECU, via processing at the ECU of image data captured by the driver monitoring camera, determines attentiveness of a driver of the vehicle.

These and other objects, advantages, purposes and features of the present invention will become apparent upon review of the following specification in conjunction with the drawings.

BRIEF DESCRIPTION OF THE DRAWINGS

FIG. 3 is a rear perspective view of the mirror-based control module of the system of FIG. 1;

FIG. 4 is a rear plan view of the mirror-based control module of the system of FIG. 1;

FIG. 5 is a front perspective view of the mirror-based control module of the system of FIG. 1;

FIG. 6 is a front plan view of the mirror-based control module of the system of FIG. 1;

DESCRIPTION OF THE PREFERRED EMBODIMENTS

A vehicle vision system and/or driver or driving assist system and/or object detection system and/or alert system operates to capture images exterior of the vehicle and may process the captured image data to display images and to detect objects at or near the vehicle and in the predicted path of the vehicle, such as to assist a driver of the vehicle in maneuvering the vehicle in a rearward direction. The vision system includes an image processor or image processing system that is operable to receive image data from one or more cameras and provide an output to a display device for displaying images representative of the captured image data. Optionally, the vision system may provide display, such as a rearview display (derived from image data captured by a rear backup camera or other rearward viewing camera of the vehicle) or a top down or bird's eye or surround view display or the like.

Figure 1:
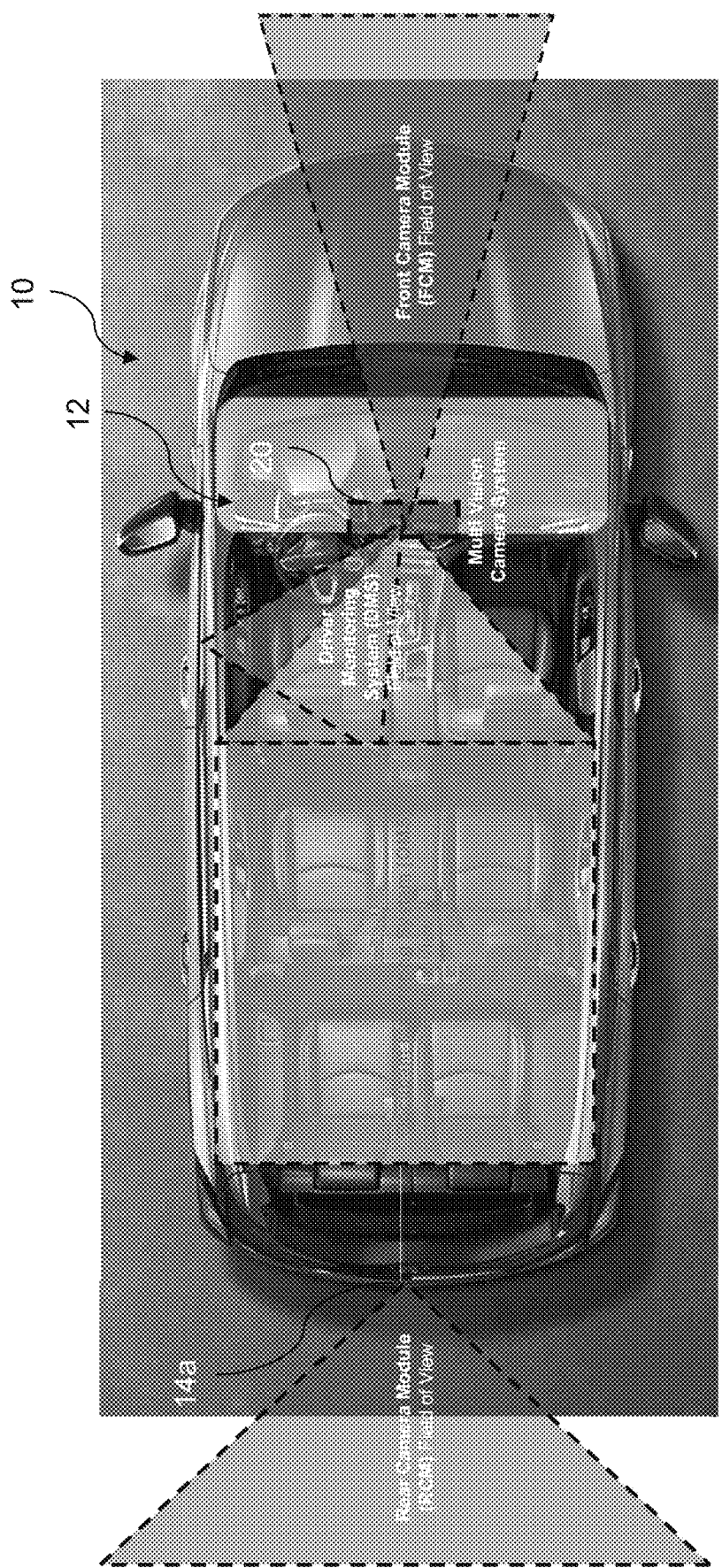
FIG. 1 is a plan view of a vehicle with a vision system that incorporates cameras in accordance with the present invention.
Figure 2:
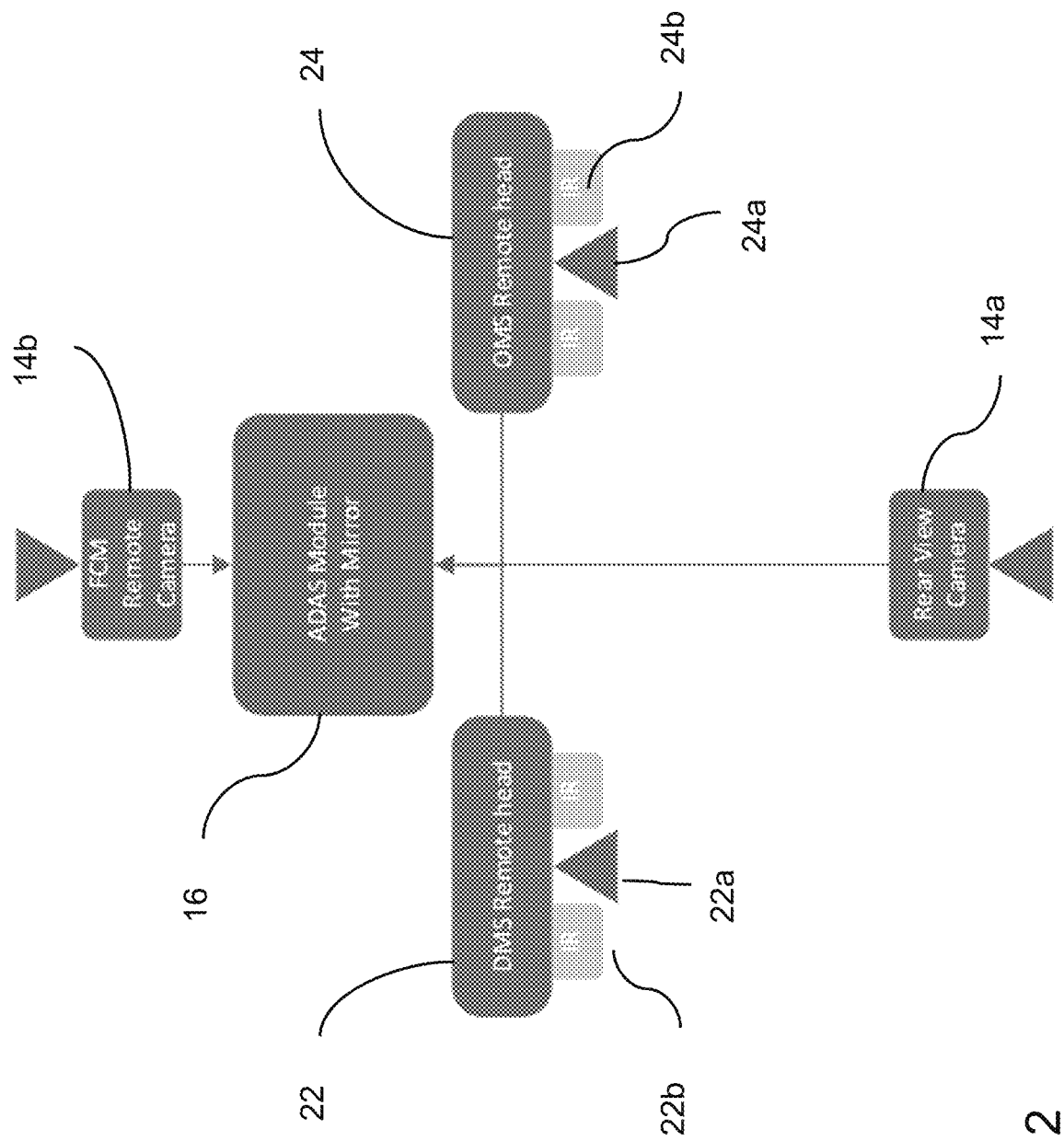
FIG. 2 is a block diagram of the system of FIG. 1.
Figure 7:
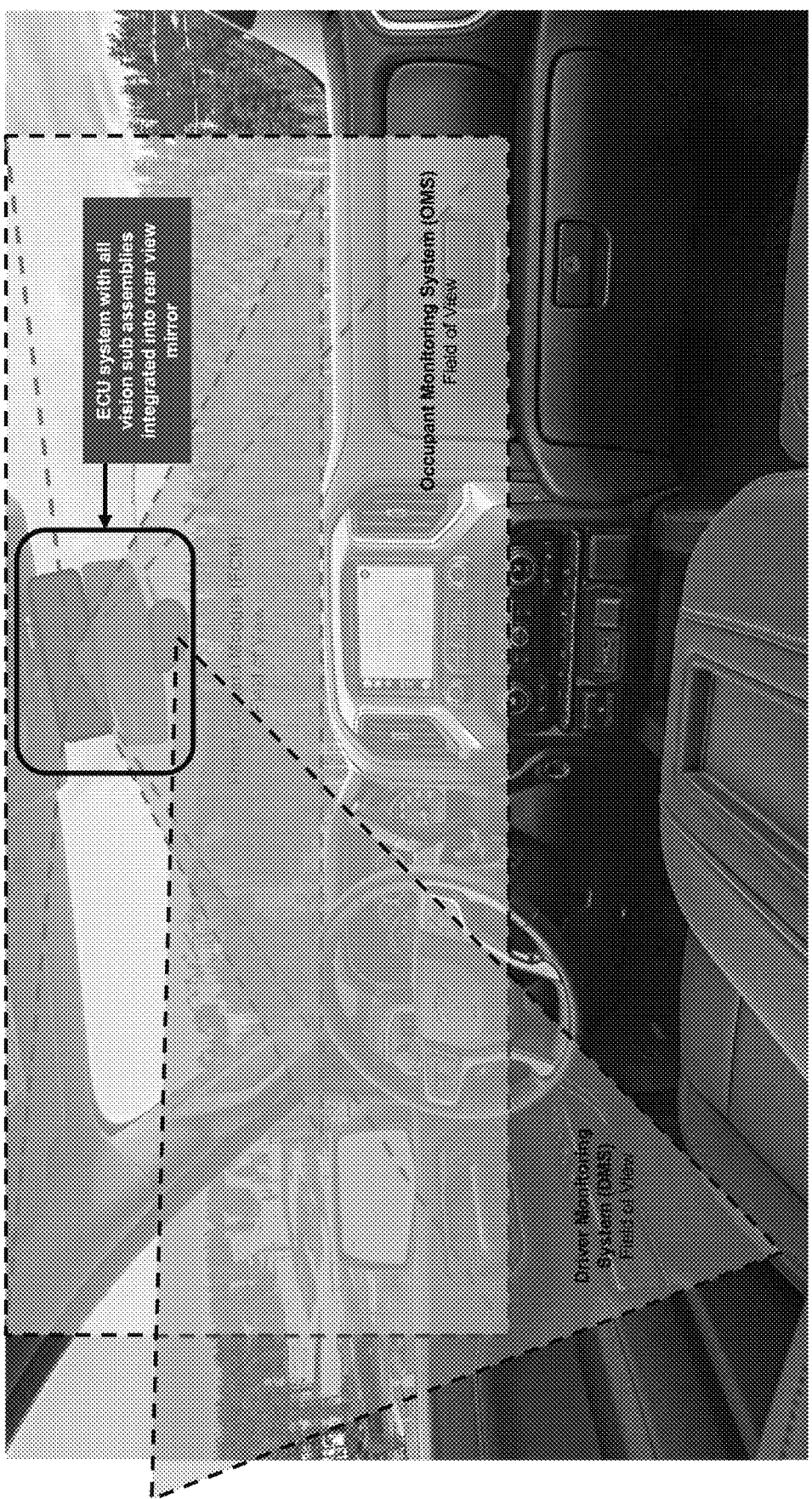
FIG. 7 is a perspective view of the cabin of the vehicle, showing the mirror based system of and different fields of view of its associated cameras.
Figure 8:
FIG. 8 is a forward view of the cabin of the vehicle, showing the interior mirror with the vision subsystems integrated therein.

Referring now to the drawings and the illustrative embodiments depicted therein, a vehicle 10 includes an imaging system or vision system 12 that includes exterior viewing imaging sensors or cameras, such as a rearward viewing imaging sensor or camera 14a and a forward viewing camera 14b disposed at and viewing forward through the windshield of the vehicle, with the camera having a lens for focusing images at or onto an imaging array or imaging plane or imager of the camera (FIG. 1). The forward viewing camera may be disposed at the windshield of the vehicle and view through the windshield and forward of the vehicle, such as for a machine vision system (such as for traffic sign recognition, headlamp control, pedestrian detection, collision avoidance, lane marker detection and/or the like). The vision system 12 includes a control or electronic control unit (ECU) or ADAS (driving assistance system) module 16 having electronic circuitry and associated software, with the electronic circuitry including a data processor or image processor that is operable to process image data captured by the camera or cameras, whereby the ECU may detect or determine presence of objects or the like and/or the system provide displayed images at a display device 18 for viewing by the driver of the vehicle. As shown in FIG. 1, the ECU and display device and forward viewing camera module are incorporated in or at an interior rearview mirror assembly 20 of the vehicle. In addition, a driver monitoring system 22 (having a camera 22a that captures image data of the driver region of the vehicle for the driver monitoring system, which determines attentiveness of the driver of the vehicle) and/or an occupant monitoring system 24 (having a camera 24a that captures image data of the passenger region of the vehicle for the occupant monitoring system, which determines presence of an occupant in the vehicle) are also incorporated in or at the interior rearview mirror assembly 20. The data transfer or signal communication from the camera to the ECU may comprise any suitable data or communication link, such as a vehicle network bus or the like of the equipped vehicle.

The vehicular vision system of the present invention integrates various vision systems, such as a Front Camera Module (FCM), a Rear Camera Module (RCM), a Driver Monitoring System (DMS) and an Occupant Monitoring System (OMS) into one ECU unit along with the interior rearview mirror without compromising the system functions and performance. The system provides a single common ECU package with multiple functions and features, and provides a cost savings with reduced packaging concerns.

As shown in FIGS. 1-4, the rear camera 14a is disposed remotely from the mirror assembly 20 (and the ECU 16) and image data captured by the rear camera (such as during a reversing maneuver of the vehicle) is communicated to the ECU 16, such as via a communication bus of the vehicle, for processing. As shown in FIGS. 1, 2, 5 and 6, the forward viewing windshield-mounted camera may be at the mirror assembly or at the mounting structure of the mirror assembly or at a separate windshield electronics module (WEM) at the windshield, and image data captured by the forward viewing camera (such as during forward maneuvering of the vehicle as the vehicle is driven forward along a road) is communicated to the ECU 16 for processing. As shown in FIGS. 1-6, the driver monitoring system head or device 22 (which may comprise an interior viewing camera 22a and one or more infrared light emitting LEDs 22b) and the occupant monitoring system head or device 24 (which may comprise an interior viewing camera 24a and one or more infrared light emitting LEDs 24b) are disposed at the mirror assembly and image data captured by their respective cameras is communicated to the ECU for processing.

In the illustrated embodiment, the driver monitoring device 22 is disposed at a lower portion of the mirror head while the occupant monitoring device 24 is disposed at an upper portion of the mirror head (to provide an enhanced view further rearward so as to encompass the rear seats of the vehicle). However, the driver and monitoring devices may otherwise be disposed at the mirror assembly, such as behind and viewing through a transflective mirror reflector of the mirror reflective element of the mirror head.

Figure 9:
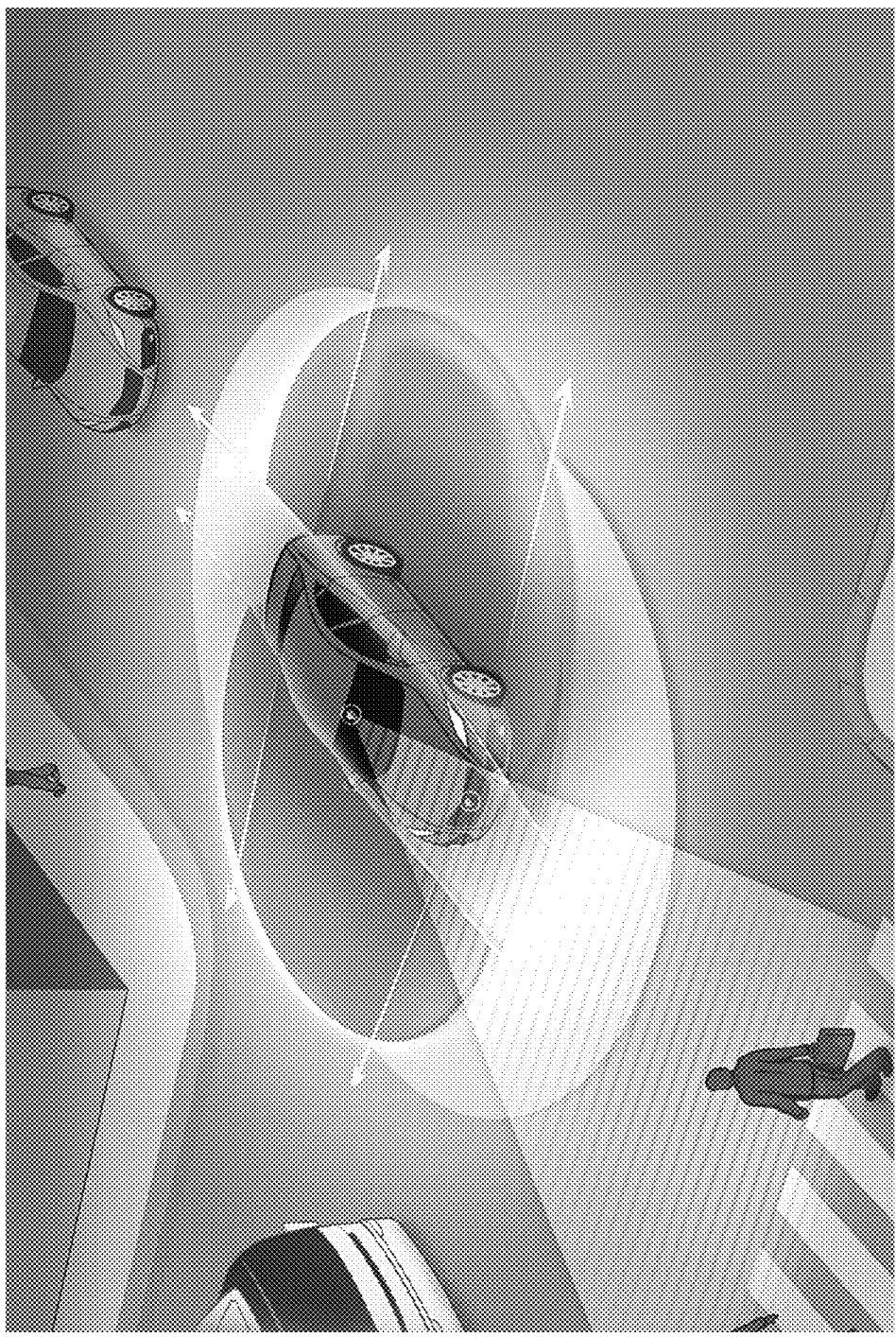
FIG. 9 is a perspective view of a vehicle having multiple cameras with respective fields of view for detecting objects and the like in the vicinity of the vehicle.

Optionally, and desirably, the ECU may also receive communications/image data from other cameras of the vehicle, such as side-mounted cameras at the driver and passenger sides and a front-mounted camera, which capture image data for use in displaying surround view images of the area around the vehicle (see FIG. 9). Optionally, the ECU may receive image data captured by side and rear viewing cameras for a camera monitoring system (CMS), with the side-mounted cameras having fields of view rearward and sideward of the vehicle and the rearward viewing camera (separate from the rear backup camera) having a field of view rearward of the vehicle. The ECU may also process image data captured by the exterior viewing cameras for use by one or more driving assist systems of the vehicle, such as a pedestrian detection system, a collision avoidance system, an object detection system, a lane keep assist system, a lane departure warning system, a backup assist system, a parking assist system and/or the like.

The system of the present invention thus provides a central or common ECU disposed at the interior rearview mirror assembly, with the ECU receiving image data captured by multiple cameras for processing and/or for displaying video images at a display device at the interior mirror assembly. The interior rearview mirror assembly may also have a driver monitoring camera (and associated IR LEDs) and an occupant monitoring camera (and associated IR LEDs) disposed thereat, with image data captured by the driver monitoring camera and the occupant monitoring camera communicated to the ECU for processing.

The driver monitoring and occupant monitoring features may utilize aspects of the systems described in U.S. Pat. Nos. 10,065,574; 10,017,114; 9,405,120 and/or 7,914,187, and/or U.S. Publication Nos. US-2020-0202151; US-2020-0143560; US-2017-0274906; US-2017-0217367; US-2016-0209647; US-2016-0137126; US-2015-0352953; US-2015-0296135; US-2015-0294169; US-2015-0092042; US-2015-0022664; US-2015-0015710; US-2015-0009010 and/or US-2014-0336876, and/or U.S. provisional application Ser. No. 63/200,451, filed Mar. 8, 2021, and/or U.S. provisional application Ser. No. 63/200,315, filed Mar. 1, 2021, and/or U.S. provisional application Ser. No. 63/200,003, filed Feb. 9, 2021, and/or U.S. provisional application Ser. No. 63/199,918, filed Feb. 3, 2021, and/or U.S. provisional application Ser. No. 62/706,707, filed Sep. 4, 2020, which are all hereby incorporated herein by reference in their entireties.

Therefore, the vehicular vision system, in some aspects, integrates various vision systems, such as a windshield-mounted forward viewing camera, a rear backup camera, a driver monitoring camera and an occupant monitoring camera into one ECU unit along with the interior rearview mirror assembly without compromising the system functions and performance. The system may utilize aspects of the systems described in U.S. patent application Ser. No. 17/248,736, filed Feb. 5, 2021, and/or U.S. provisional applications, Ser. No. 63/199,858, filed Jan. 29, 2021, and Ser. No. 63/199,526, filed Jan. 6, 2021, which are hereby incorporated herein by reference in their entireties.

Modern vision systems (e.g., Front Camera Modules (FCM), In-Cabin monitoring systems/Driver Monitoring Systems (DMS), and Occupant Monitoring systems (OMS))

are facing significant issues due to stray light, reflections, and low sun light condition which cause major concerns for vision system functionality. That is, these issues impact the features and functions available to the vision system due to, for example, ghost images and sudden vision blockage. Thus, these issues not only degrade the performance of the vision system, but also pose a serious safety concern for semi/fully autonomous vehicles. Additionally, in-cabin monitoring systems face substantial challenges in order to maintain eye safety limits as these systems typically operate with near infrared (NIR) light sources which may cause damage to occupants' eyes upon prolonged exposure to the light source.

In some aspects of the invention, the vision system incorporates electro-optic (such as electrochromic) technology to control optical properties such as optical translucence, absorption, reflectance and/or emittance in a continual but reversible manner on application of voltage (i.e., electrochromism). This property enables an electrochromic device to be used for applications such as smart glass, mirrors, displays and any vision-based systems. The vision system may include electrochromic technology to control translucency of an NIR light emitting diode (LED) source by varying the application of voltage. The vision system may use electrochromism as a neural density (ND) filter, which for front cameras may reject invisible light (i.e., nonvisible light) from the sun which improves thermal performance. Alternatively or additionally, an in-cabin camera (e.g., a NIR camera) using electrochromic technology may limit or reject visible light from the sun (or other sources) to improve NIR operating performance by reducing added noise form other spectrums.

The electrochromic element may be disposed in front of the driver monitoring camera (and/or the occupant monitoring camera) and may be activated to attenuate visible light while transmitting near infrared light therethrough (such as by utilizing aspects of the electrochromic mirror elements described in U.S. Pat. No. 7,274,501, which is hereby incorporated herein by reference in its entirety). The electrochromic element may be activated responsive to activation of a near infrared light emitter (such as an emitter disposed at the mirror assembly) that emits near infrared light into the cabin of the vehicle (such as to illuminate the driver region and/or occupant region in the cabin of the vehicle with near infrared light), so that the emitted near infrared light reflects off of the driver and is allowed to pass through the electrochromic element so as to be imaged by the driver monitoring camera (while visible light is attenuated by the electrochromic element so as to not be fully imaged by the driver monitoring camera). Optionally, the electrochromic element may be activated responsive to determination that ambient light is below a threshold level at which the near infrared light emitter may be activated when the driver monitoring camera is operating.

Thus, the vision system, in some aspects, eliminates use of separate light traps or shields and issues with reflection, stray light and low sunlight are limited or rejected. Additionally, the vision system protects the eyes of occupants from longer exposure to, for example, infrared light for all in cabin applications.

Figure 10:
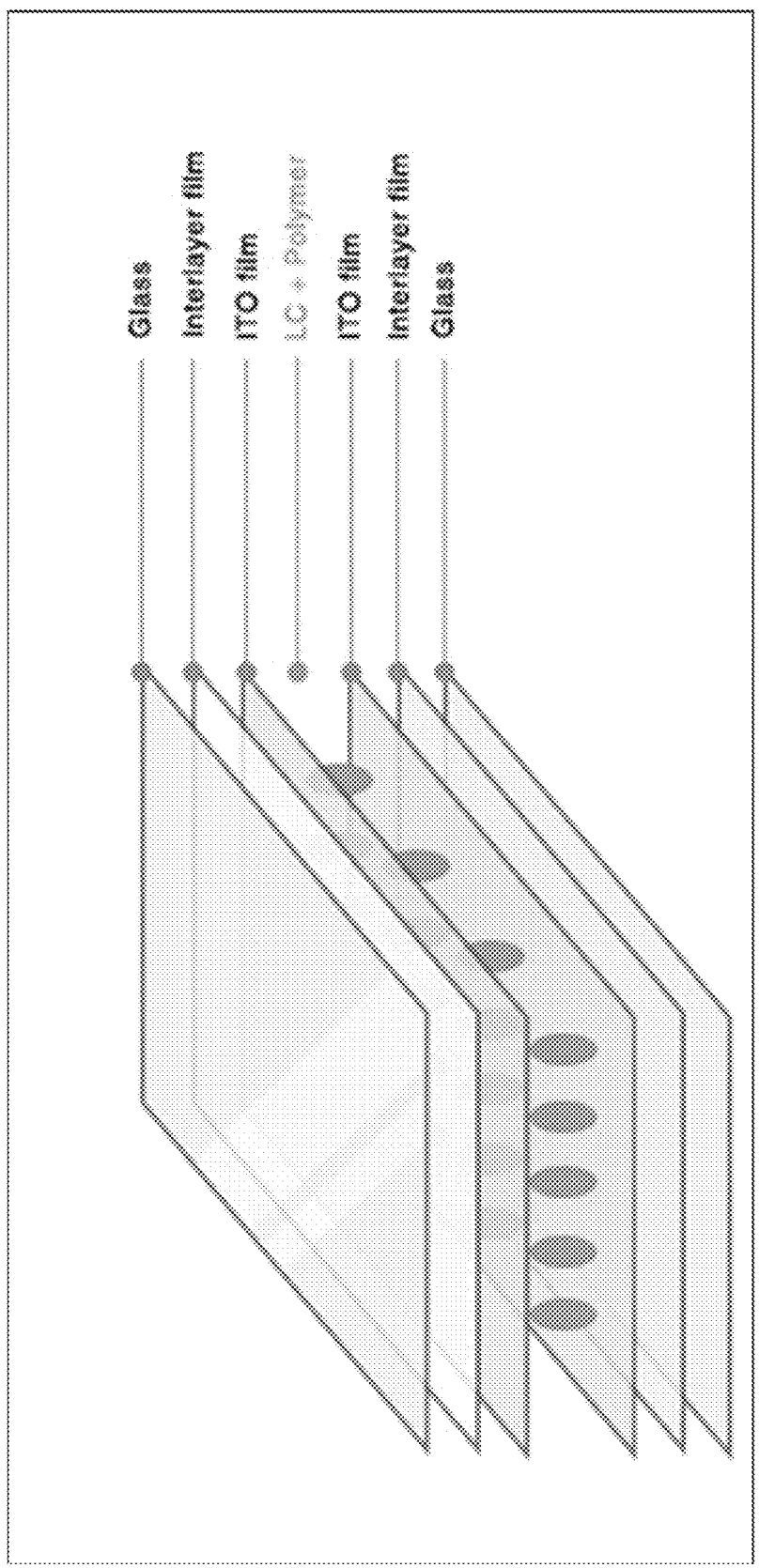
FIG. 10 is a schematic view of a layer stackup of an electrochromic glass structure.
Figure 11:
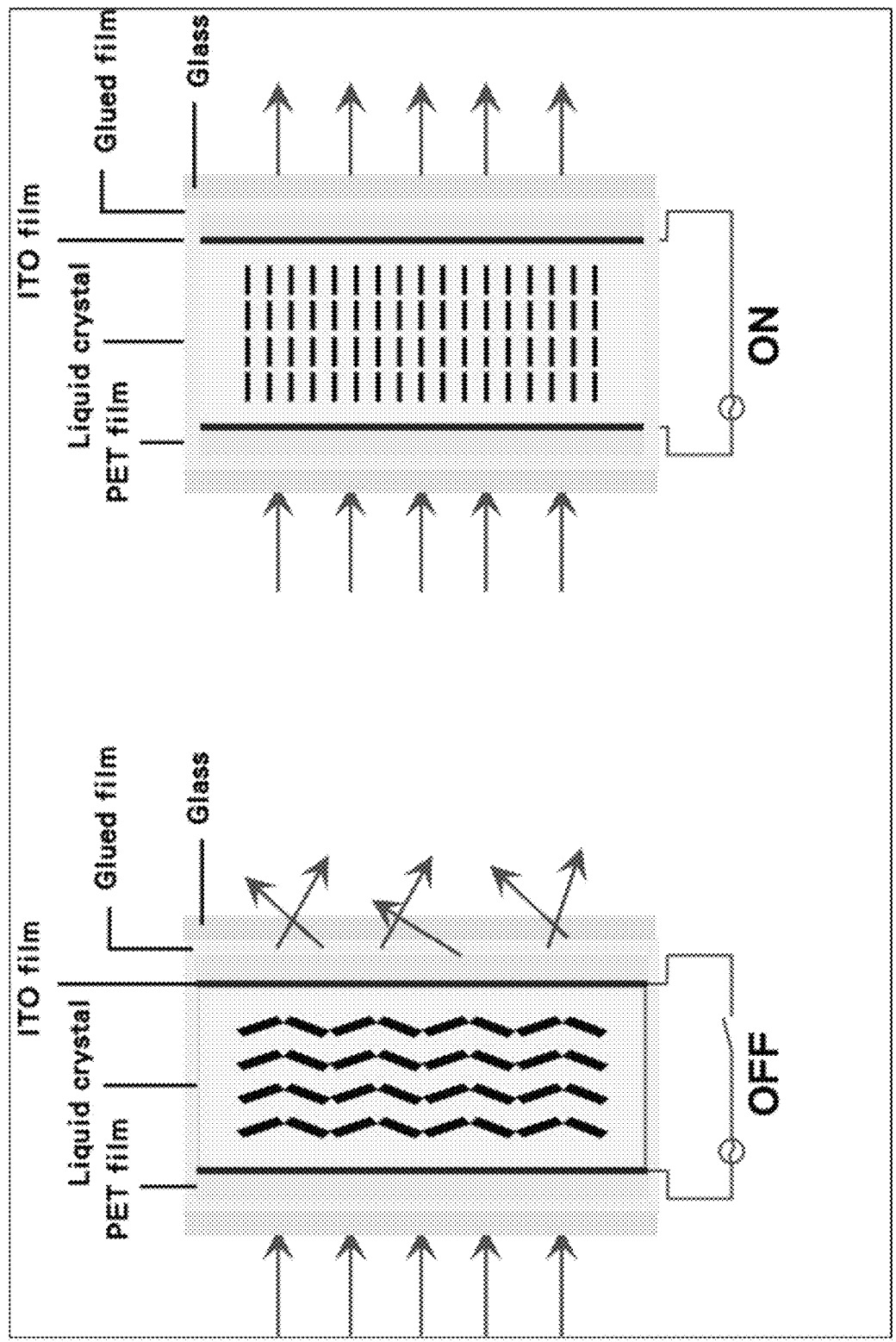
FIG. 11 is a schematic view of another layer stackup of an electrochromic glass structure.
Figure 12:
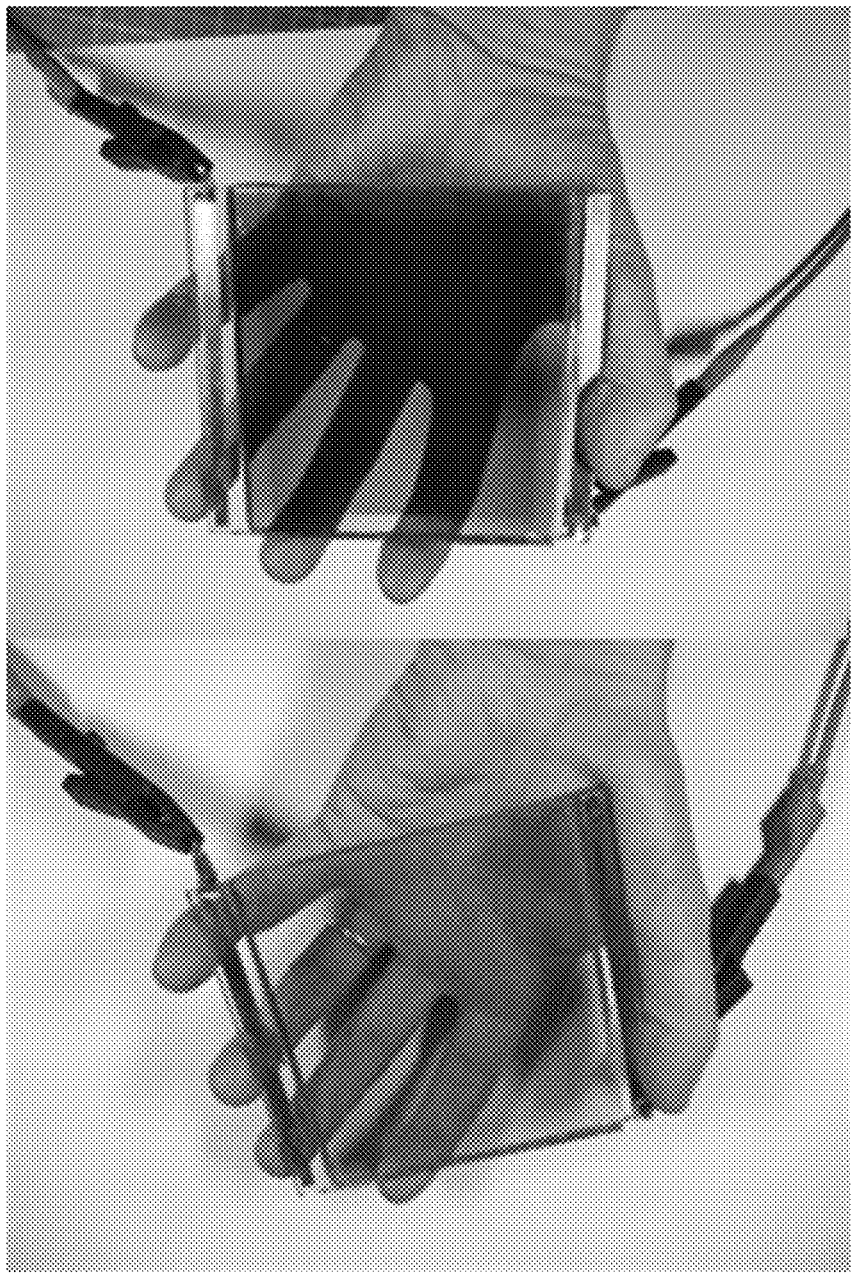
FIG. 12 is a perspective view of a bleached state and a colored state of electrochromic glass.

Referring now to FIGS. 10 and 11, the vision system may include a glass structure interposed between the camera and the camera's field of view (FOV). For example, the glass structure may be placed over or in front of a lens of the camera (FIG. 13) or attached to the windshield for a front-facing camera. Alternatively, the glass structure may be integrated into the windshield for a front-facing camera. The glass structure may include a top and bottom layer of glass with interlayer films, indium tin oxide (ITO) films (or other suitable transparent electrically conductive films or layers that are in contact with the electro-optic polymer or medium), and liquid crystal (LC) and polymers disposed in between the layers of glass (FIG. 10). Optionally, the glass structure includes polyethylene terephthalate (PET) film and glued film (FIG. 11) in between the top and bottom layers of glass. As can be seen with reference to FIG. 11, the liquid crystal interlayer, when not powered or energized, has its particles not aligned so that light does not freely transmit through the element. When the LC interlayer is powered, the particles are aligned so that light freely passes through the element. FIG. 12 illustrates functionality of the glass structure of FIGS. 10 and 11. For example, the glass may include transparent redox electrolyte to provide a bleached and colored state (FIG. 12).

Figure 13:
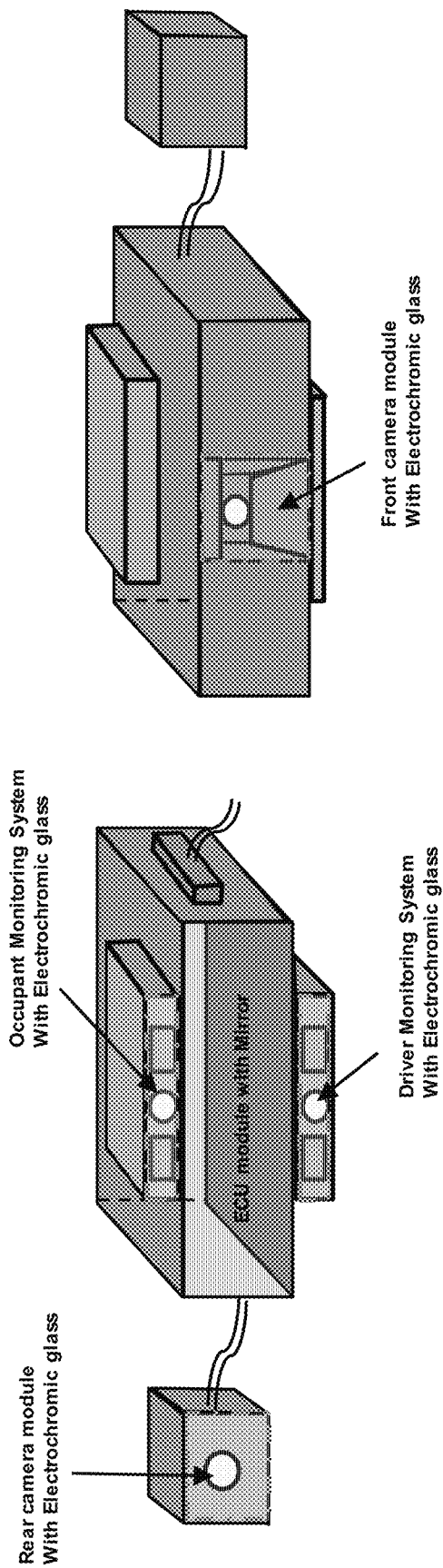
FIG. 13 is a schematic view of a front facing camera, a rear facing camera, and a driver monitoring camera equipped with electrochromic glass.

Referring now to FIG. 13, the vision system may include a front facing camera (e.g., viewing forward through the windshield of the vehicle) and/or a rear facing camera (e.g., at the rear of the vehicle with a FOV rear of the vehicle). Additionally or alternatively, the vision system may include one or more occupant monitoring cameras disposed within and having a FOV of the interior of the vehicle. Each camera includes an electrochromic glass cover disposed between the camera lens and the FOV of the camera. Optionally, the camera lens includes the EC glass structure. The vision system may monitor existing light conditions (e.g., via a light sensor) to operate the state of the EC glass structure and darken the glass when appropriate. For example, when the vehicle is travelling towards the setting sun, the vision system may determine degradation in performance of the front-facing camera and darken the EC structure accordingly. In applications where the occupant monitoring camera operates in conjunction with an infrared or near infrared light emitting diode (for illuminating the driver or occupant to enhance nighttime monitoring), an electrochromic glass cover may be disposed over or in front of the LED(s) to selectively limit or attenuate the light to avoid excessive exposure of the driver or passenger eyes to the infrared light. Other imaging sensors may also benefit from the EC glass structure (e.g., radar, lidar, etc.). The vision system may utilize aspects of the systems described in U.S. Publication No. US-2020-0296273 and/or U.S. patent application Ser. No. 16/949,127, filed Oct. 15, 2020, which are hereby incorporated herein by reference in their entireties.

The front camera module is widely used to the automotive industry for vehicle detection and accident avoidance. One challenge is to maintain the imager's operating temperature within an acceptable range even during operation at high ambient temperatures (such as during operation of the camera on a hot sunny day, where the vehicle cabin at or near the windshield often reaches temperatures in excess of 100 degrees F.). The present invention keeps the imager and camera module below its maximum operational temperature at high ambient temperatures.

Vision systems features and functions are increasing significantly to meet international standards and regulations. More features and function means high processing speed and more power consumption, and the higher the power consumption, the higher the heat generation by the system. To make system work more efficiently, without degrading performance and durability, heat dissipation/heat transfer should be well designed to take away heat from the system.

In some aspects of the invention, the vision system and front camera module utilizes heat pipe technology to make the system dissipate heat more effectively and at a faster rate, even without need of any secondary air flow or fluid flow source (e.g., a fan or water cooling system or the like).

Figure 14:
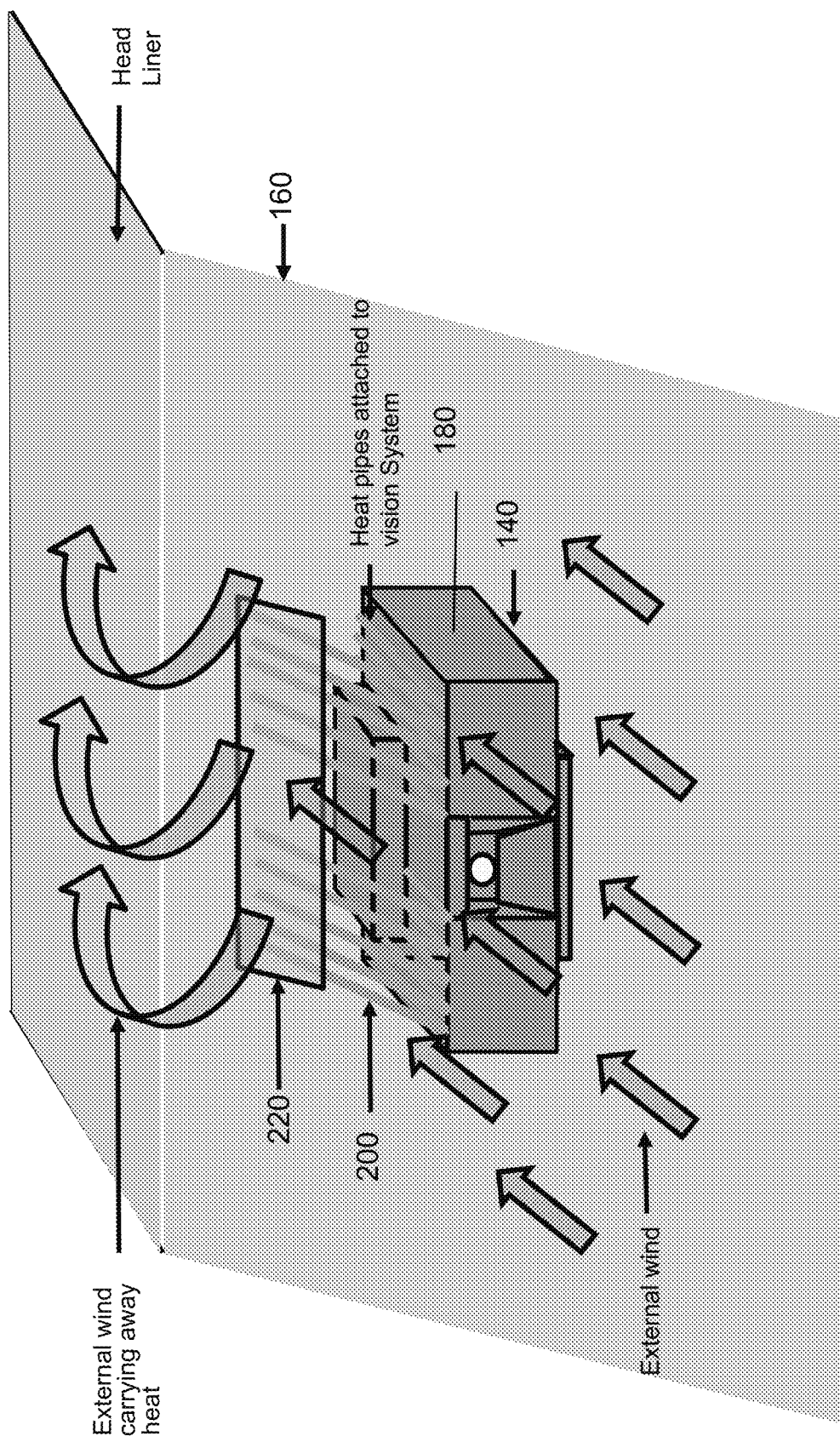
FIG. 14 is a perspective view of the forward facing camera module of the present invention, shown with the thermal element and heat pipes disposed at the outer case or housing of the camera module and attached at the windshield.
Figure 15:
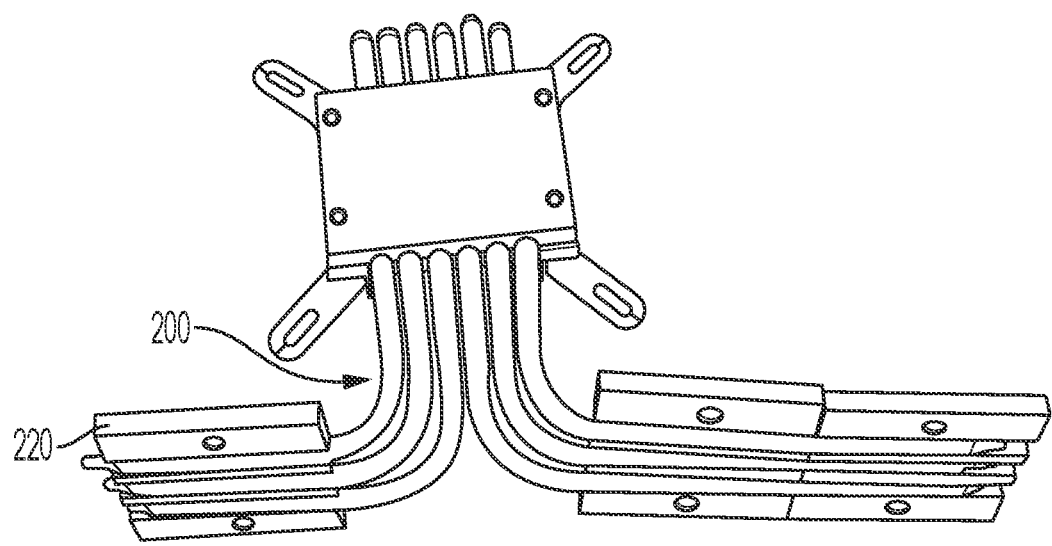
FIG. 15 is a perspective view of a heat pipe system suitable for attaching at the camera module and attaching at the windshield.

A camera module 140 structure or housing 180 is configured to support the imager PCB and lens barrel and a main or processing PCB having the image processor and other circuitry for the vision system. As shown in FIG. 14, the system includes a series or plurality of heat pipes 200 that have one end attached at the housing 180 and that have the other end attached at the windshield. In the illustrated embodiment, the heat pipes are disposed along the upper portion of the camera module housing 180 to draw heat from the housing toward the windshield. The heat pipes 200 are routed along the in-cabin side of the windshield and terminate at the windshield above the camera module 140. The upper or distal ends of the heat pipes (distal from the camera module) may be disposed at an attaching plate or structure or element 220 that thermally conductively couples or attaches the ends of the heat pipes to the in-cabin side of the vehicle windshield (FIG. 15).

Although shown and described with the proximal ends of the heat pipes being disposed at and thermally coupled to an upper portion of the camera housing, the heat pipes may be disposed at and thermally coupled at other portions of the camera module, such as at a lower housing portion, which may be thermally coupled to the image processor via a thermal element disposed within the camera housing. Also, although shown and described with the distal ends of the heat pipes extending upward along the windshield above the camera module, the heat pipes may be configured to otherwise extend along the in-cabin side of the windshield, such as laterally or downward along the windshield. The heat pipes are preferably disposed at a region of the windshield that has a non-light transmitting or light absorbing or black-out layer or frit layer established thereat, such that the heat pipes are not viewable by a person viewing the windshield from exterior the vehicle. Likewise, the heat pipes may be small enough and may be dark colored or may be encased in a housing or cover at the in-cabin side of the windshield so as to not be viewable by a person viewing the windshield from inside the vehicle.

The heat pipes function to draw heat from the heated camera module (which heats during operation of the camera module and vision system) toward a cooler location at the in-cabin side of the vehicle windshield. The heat pipes include a fluid disposed therein that, when heated, evaporates to vapor and absorbs thermal energy. The vapor moves along an inner passageway of the respective pipe toward and to the lower temperature end of the heat pipe, where the vapor condenses back to fluid and is absorbed by a wicking element, thereby releasing thermal energy. The fluid flows back to the higher temperature end and the cycle repeats.

Thus, the heat pipes are attached at one end to a heat source (the camera module) and are routed along the windshield to a distal end that is attached at or thermally conductively coupled with the windshield, which acts as a heat sink to cool the vapor in the heat pipes so it condenses back to fluid. As shown in FIG. 14, as the vehicle travels along a road, the external wind flows along the windshield to cool the windshield and carries the heat away from the region of the windshield where the distal ends of the heat pipes are coupled. The attaching structure or element 22 may include heat dissipating fins or a heat sink or the like to further thermally conductively couple to the windshield to enhance heat dissipation at the windshield. The housing of the camera module may be thermally conductively coupled to a heat generating component of the camera module (such as to the image processor at the printed circuit board in the camera module) to provide enhanced dissipation of heat generated by the processor during operation of the camera and while the vehicle is driven along a road.

Therefore, in some aspects, the present invention provides a thermal element or heat transfer element that is disposed in contact with the outer housing or casing of the camera module and in thermally conductive contact with the in-cabin side of the windshield. The thermal element comprises a plurality of heat pipes that function to draw heat from the heated camera module and to dissipate the heat at the windshield so that the heat is carried away via the wind or airflow at the exterior side of the vehicle windshield.

Figure 16B:
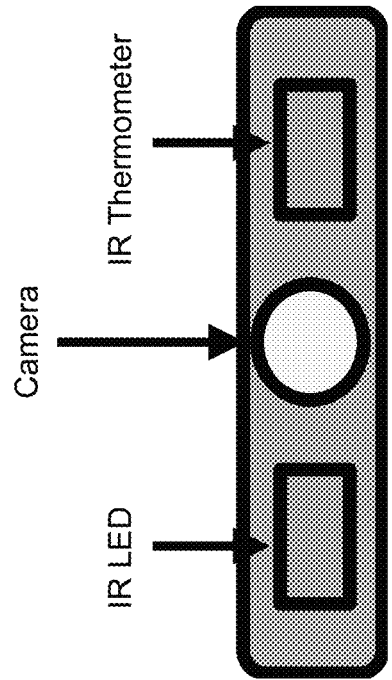
FIGS. 16A and 16B are schematic views of a light source, camera, and thermometer in accordance with the present invention.
Figure 16A:
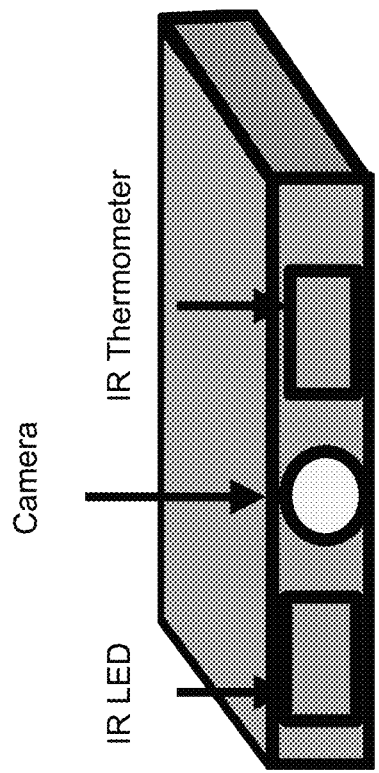

It is sometimes advantageous to perform basic health checks on occupants of a vehicle. For example, temperature monitoring may indicate a fever or other symptoms of an illness or other condition. Referring now to FIGS. 16A and 16B, the driver monitoring systems (DMS) or occupant monitoring systems (OMS) of the present invention monitors the interior of a cabin of an equipped vehicle with integrated infrared technology to measure body temperature of a driver and/or passengers in the vehicle. Integration of infrared technology into a DMS and/or OMS assists with monitoring body temperature and may also warn the occupants when the system detects an abnormal body temperature of either the driver or passengers.

In some aspects of the invention, the system incorporates a light source, such as an infrared (IR) light emitting diode (LED) to illuminate the occupants of the vehicle with infrared light. The system also includes a camera that has a field of view that includes at least a portion of the driver and/or passengers of the vehicle (e.g., a driver monitoring camera or an occupant monitoring camera). For example, a field of view of a camera (or other imaging sensor) may include a face of one or more occupants of the vehicle. The system also includes an IR thermometer to measure the temperature of surfaces within the vehicle (such as the temperature of the faces or other exposed portions of one or more occupants of the vehicle).

Figure 17:
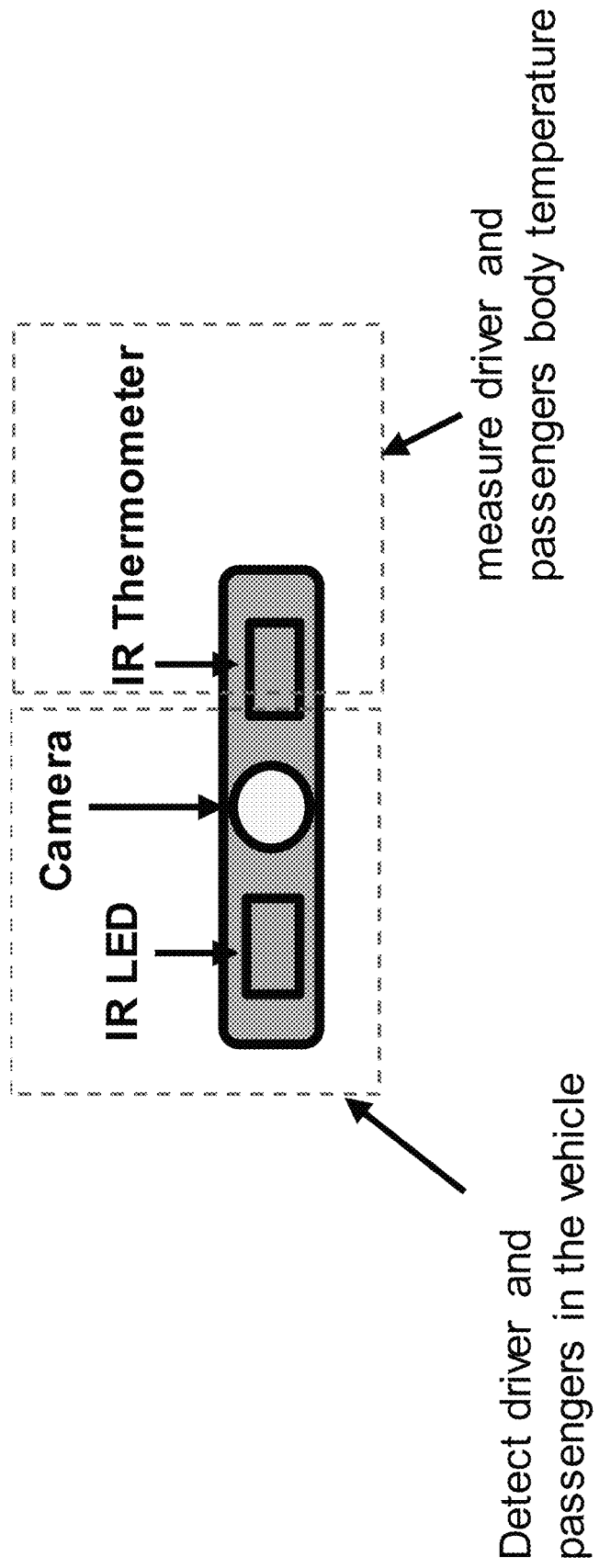
FIG. 17 is a schematic view illustrating functions of the light source, camera, and thermometer of FIGS. 16A and 16B.

Referring now to FIG. 17, the camera may detect a presence of an occupant of the vehicle (e.g., via face detection, eye detection, etc.). The IR light source may illuminate the interior of the vehicle to assist the camera with detection of occupants with light invisible to the occupants so as to not impede their vision. Responsive to detection of an occupant, the system may measure the temperature of the occupant(s) using the IR thermometer. The thermometer may report the temperature of each occupant to the system.

The system may thus monitor the temperature of each occupant of the vehicle. The system may display the temperature of each occupant on a display in a vehicle (e.g., in response to a request from an occupant of the vehicle via, for example, a user-actuatable input). Optionally, the system may warn or notify the occupants if the monitored temperature of one or more of the occupants is below a minimum threshold or exceeds a maximum threshold. For example, the system may display a warning on the display or emit an audible warning when the system detects that the temperature of an occupant is indicative of a health concern by either being lower than the minimum threshold or higher than the maximum threshold. The thresholds may be user configurable (e.g., via the display or touch screen).

Figure 18:
FIG. 18 is a perspective view of an interior of a vehicle equipped with an occupant monitoring system in accordance with the present invention.

Referring now to FIG. 18, a housing for enclosing the IR LED, camera, and IR thermometer may be mounted at, for example, an interior rearview mirror of the vehicle. The housing may be mounted at other locations within the vehicle as well, such as locations with clear line of sight of the faces of one or more occupants of the vehicle (e.g., at the headliner of the vehicle). Optionally, an IR thermometer (alone or in conjunction with an IR LED and camera) may be provided with an exterior field of view at a door of the vehicle so that the system can determine the temperature of a person before that person enters the vehicle. For example, the IR thermometer may be disposed at an exterior rearview mirror of the vehicle and may view sideward to encompass a person approaching one of the side doors of the vehicle.

Optionally, the mounting of the forward viewing camera at the mirror assembly or mirror mounting structure may utilize aspects of windshield electronics modules (WEM) or the like, and the forward viewing camera may utilize aspects of the systems described in U.S. Pat. Nos. 9,896,039; 9,871,971; 9,596,387; 9,487,159; 8,256,821; 7,480,149; 6,824,281 and/or 6,690,268, and/or U.S. Publication Nos. US-2015-0327398; US-2015-0015713; US-2014-0160284; US-2014-0226012 and/or US-2009-0295181, which are all hereby incorporated herein by reference in their entireties.

The camera or sensor may comprise any suitable camera or sensor. Optionally, the camera may comprise a "smart camera" that includes the imaging sensor array and associated circuitry and image processing circuitry and electrical connectors and the like as part of a camera module, such as by utilizing aspects of the vision systems described in International Publication Nos. WO 2013/081984 and/or WO 2013/081985, which are hereby incorporated herein by reference in their entireties.

The system includes an image processor operable to process image data captured by the camera or cameras, such as for detecting objects or other vehicles or pedestrians or the like in the field of view of one or more of the cameras. For example, the image processor may comprise an image processing chip selected from the EYEQ family of image processing chips available from Mobileye Vision Technologies Ltd. of Jerusalem, Israel, and may include object detection software (such as the types described in U.S. Pat. Nos. 7,855,755; 7,720,580 and/or 7,038,577, which are hereby incorporated herein by reference in their entireties), and may analyze image data to detect vehicles and/or other objects. Responsive to such image processing, and when an object or other vehicle is detected, the system may generate an alert to the driver of the vehicle and/or may generate an overlay at the displayed image to highlight or enhance display of the detected object or vehicle, in order to enhance the driver's awareness of the detected object or vehicle or hazardous condition during a driving maneuver of the equipped vehicle.

The vehicle may include any type of sensor or sensors, such as imaging sensors or radar sensors or lidar sensors or ultrasonic sensors or the like. The imaging sensor or camera may capture image data for image processing and may comprise any suitable camera or sensing device, such as, for example, a two dimensional array of a plurality of photosensor elements arranged in at least 640 columns and 480 rows (at least a 640×480 imaging array, such as a megapixel imaging array or the like), with a respective lens focusing images onto respective portions of the array. The photosensor array may comprise a plurality of photosensor elements arranged in a photosensor array having rows and columns. Preferably, the imaging array has at least 300,000 photosensor elements or pixels, more preferably at least 500,000 photosensor elements or pixels and more preferably at least 1 million photosensor elements or pixels. The imaging array may capture color image data, such as via spectral filtering at the array, such as via an RGB (red, green and blue) filter or via a red/red complement filter or such as via an RCC (red, clear, clear) filter or the like. The logic and control circuit of the imaging sensor may function in any known manner, and the image processing and algorithmic processing may comprise any suitable means for processing the images and/or image data.

For example, the vision system and/or processing and/or camera and/or circuitry may utilize aspects described in U.S. Pat. Nos. 9,233,641; 9,146,898; 9,174,574; 9,090,234; 9,077,098; 8,818,042; 8,886,401; 9,077,962; 9,068,390; 9,140,789; 9,092,986; 9,205,776; 8,917,169; 8,694,224; 7,005,974; 5,760,962; 5,877,897; 5,796,094; 5,949,331; 6,222,447; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978; 7,859,565; 5,550,677; 5,670,935; 6,636,258; 7,145,519; 7,161,616; 7,230,640; 7,248,283; 7,295,229; 7,301,466; 7,592,928; 7,881,496; 7,720,580; 7,038,577; 6,882,287; 5,929,786 and/or 5,786,772, and/or U.S. Publication Nos. US-2014-0340510; US-2014-0313339; US-2014-0347486; US-2014-0320658; US-2014-0336876; US-2014-0307095; US-2014-0327774; US-2014-0327772; US-2014-0320636; US-2014-0293057; US-2014-0309884; US-2014-0226012; US-2014-0293042; US-2014-0218535; US-2014-0218535; US-2014-0247354; US-2014-0247355; US-2014-0247352; US-2014-0232869; US-2014-0211009; US-2014-0160276; US-2014-0168437; US-2014-0168415; US-2014-0160291; US-2014-0152825; US-2014-0139676; US-2014-0138140; US-2014-0104426; US-2014-0098229; US-2014-0085472; US-2014-0067206; US-2014-0049646; US-2014-0052340; US-2014-0025240; US-2014-0028852; US-2014-005907; US-2013-0314503; US-2013-0298866; US-2013-0222593; US-2013-0300869; US-2013-0278769; US-2013-0258077; US-2013-0258077; US-2013-0242099; US-2013-0215271; US-2013-0141578 and/or US-2013-0002873, which are all hereby incorporated herein by reference in their entireties. The system may communicate with other communication systems via any suitable means, such as by utilizing aspects of the systems described in U.S. Pat. Nos. 10,071,687; 9,900,490; 9,126,525 and/or 9,036,026, which are hereby incorporated herein by reference in their entireties.

The camera module and circuit chip or board and imaging sensor may be implemented and operated in connection with various vehicular vision-based systems, and/or may be operable utilizing the principles of such other vehicular systems, such as a vehicle headlamp control system, such as the type disclosed in U.S. Pat. Nos. 5,796,094; 6,097,023; 6,320,176; 6,559,435; 6,831,261; 7,004,606; 7,339,149 and/or 7,526,103, which are all hereby incorporated herein by reference in their entireties, a rain sensor, such as the types disclosed in U.S. Pat. Nos. 6,353,392; 6,313,454; 6,320,176 and/or 7,480,149, which are hereby incorporated herein by reference in their entireties, a vehicle vision system, such as a forward, sideward or rearward directed vehicle vision system utilizing principles disclosed in U.S. Pat. Nos. 5,550,677; 5,670,935; 5,760,962; 5,877,897; 5,949,331; 6,222,447; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978 and/or 7,859,565, which are all hereby incorporated herein by reference in their entireties, a trailer hitching aid or tow check system, such as the type disclosed in U.S. Pat. No. 7,005,974, which is hereby incorporated herein by reference in its entirety, a reverse or sideward imaging system, such as for a lane change assistance system or lane departure warning system or for a blind spot or object detection system, such as imaging or detection systems of the types disclosed in U.S. Pat. Nos. 7,881,496; 7,720,580; 7,038,577; 5,929,786 and/or 5,786,772, which are hereby incorporated herein by reference in their entireties, a video device for internal cabin surveillance and/or video telephone function, such as disclosed in U.S. Pat. Nos. 5,760,962; 5,877,897; 6,690,268 and/or 7,370,983, and/or U.S. Publication No. US-2006-0050018, which are hereby incorporated herein by reference in their entireties, a traffic sign recognition system, a system for determining a distance to a leading or trailing vehicle or object, such as a system utilizing the principles disclosed in U.S. Pat. Nos. 6,396,397 and/or 7,123,168, which are hereby incorporated herein by reference in their entireties, and/or the like.

Optionally, the vision system may include a display for displaying images captured by one or more of the imaging sensors for viewing by the driver of the vehicle while the driver is normally operating the vehicle. Optionally, for example, the vision system may include a video display device, such as by utilizing aspects of the video display systems described in U.S. Pat. Nos. 5,530,240; 6,329,925; 7,855,755; 7,626,749; 7,581,859; 7,446,650; 7,338,177; 7,274,501; 7,255,451; 7,195,381; 7,184,190; 5,668,663; 5,724,187; 6,690,268; 7,370,983; 7,329,013; 7,308,341; 7,289,037; 7,249,860; 7,004,593; 4,546,551; 5,699,044; 4,953,305; 5,576,687; 5,632,092; 5,708,410; 5,737,226; 5,802,727; 5,878,370; 6,087,953; 6,173,501; 6,222,460; 6,513,252 and/or 6,642,851, and/or U.S. Publication Nos. US-2014-0022390; US-2012-0162427; US-2006-0050018 and/or US-2006-0061008, which are all hereby incorporated herein by reference in their entireties.

Optionally, the vision system (utilizing the forward viewing camera and a rearward viewing camera and other cameras disposed at the vehicle with exterior fields of view) may be part of or may provide a display of a top-down view or bird's-eye view system of the vehicle or a surround view at the vehicle, such as by utilizing aspects of the vision systems described in U.S. Pat. Nos. 10,071,687; 9,900,522; 9,834,153; 9,762,880; 9,596,387; 9,126,525 and/or 9,041,806, and/or U.S. Publication Nos. US-2015-0022664 and/or US-2012-0162427, which are hereby incorporated by reference in their entireties.

The display device may be disposed at or incorporated in an interior mirror assembly, and the interior mirror assembly may comprise a dual-mode interior rearview video mirror that can switch from a traditional reflection mode to a live-video display mode, such as is by utilizing aspects of the mirror assemblies and systems described in U.S. Pat. Nos. 10,442,360; 10,421,404; 10,166,924 and/or 10,046,706, and/or U.S. Publication Nos. US-2019-0258131; US-2019-0146297; US-2019-0118717 and/or US-2017-0355312, and/or U.S. patent application Ser. No. 17/248,736, filed Feb. 5, 2021, Ser. No. 16/949,976, filed Nov. 23, 2020, and/or Ser. No. 17/247,127, filed Dec. 1, 2020, and/or U.S. provisional applications, Ser. No. 63/199,858, filed Jan. 29, 2021, and Ser. No. 63/199,526, filed Jan. 6, 2021, which are all hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A vehicular vision system comprising:
an electronic control unit (ECU) disposed at an interior rearview mirror assembly of a vehicle equipped with the vehicular vision system, wherein the ECU comprises electronic circuitry and associated software;
wherein the interior rearview mirror assembly includes a mirror head pivotally mounted at a mounting structure configured to attach at an in-cabin side of a windshield of the vehicle, and wherein the mirror head includes a mirror casing and a mirror reflective element;
wherein the mirror reflective element comprises a transflective mirror reflector;
a driver monitoring camera disposed at the mirror head of the interior rearview mirror assembly and viewing through the transflective mirror reflector of the mirror reflective element, wherein, with the mounting structure attached at the in-cabin side of the windshield of the vehicle, the driver monitoring camera has a first field of view of a driver region in a cabin of the vehicle, and wherein image data captured by the driver monitoring camera is provided to the ECU;
an occupant monitoring camera disposed at the mirror head of the interior rearview mirror assembly and viewing through the transflective mirror reflector of the mirror reflective element, wherein, with the mounting structure attached at the in-cabin side of the windshield of the vehicle, the occupant monitoring camera has a second field of view of an occupant region in the cabin of the vehicle that is different than the first field of view of the driver monitoring camera, and wherein image data captured by the occupant monitoring camera is provided to the ECU;
at least one near infrared light-emitting light emitting diode disposed at the interior rearview mirror assembly and operable to emit near infrared light, wherein, with the mounting structure attached at the in-cabin side of the windshield of the vehicle, the at least one near infrared light-emitting light emitting diode operates to emit near infrared light into the cabin of the vehicle at least when at least one selected from the group consisting of (i) the driver monitoring camera is activated and (ii) the occupant monitoring camera is activated;
wherein the driver monitoring camera and the occupant monitoring camera view through an electrochromic element, and wherein the electrochromic element comprises a transparent front glass substrate, a transparent rear glass substrate, and an electrochromic medium disposed between the transparent front glass substrate and the transparent rear glass substrate;
wherein the electrochromic element is electrically dimmable to attenuate visible light incident at the electrochromic element to reduce incidence of visible light at the driver monitoring camera and the occupant monitoring camera while allowing near infrared light to pass through the electrochromic element to be incident at the driver monitoring camera and the occupant monitoring camera;
wherein the electrochromic element is electrically dimmed at least in part responsive to operation of the at least one near infrared light-emitting light emitting diode;
wherein the electronic circuitry of the ECU comprises an image processor operable to process image data captured by the driver monitoring camera and the occupant monitoring camera; and
wherein the ECU, via processing at the ECU of image data captured by the driver monitoring camera, determines attentiveness of a driver of the vehicle.

2. The vehicular vision system of claim 1, further comprising a video mirror display screen disposed at the interior rearview mirror assembly of the vehicle.

3. The vehicular vision system of claim 2, wherein a rearward viewing camera is disposed at a rear portion of the vehicle and has a rearward field of view at least rearward of the vehicle, and wherein image data captured by the rearward viewing camera is provided to the ECU.

4. The vehicular vision system of claim 3, wherein the video mirror display screen is operable to display video images derived provided by the ECU based on image data captured by the rearward viewing camera and provided to the ECU.

5. The vehicular vision system of claim 1, wherein a forward viewing camera is disposed at a windshield of the vehicle and having a forward field of view through the windshield and at least forward of the vehicle, and wherein image data captured by the forward viewing camera is provided to the ECU.

6. The vehicular vision system of claim 5, wherein the ECU, via processing at the ECU of image data captured by the forward viewing camera, provides an output for a driving assistance system of the vehicle.

7. The vehicular vision system of claim 1, wherein the driver monitoring camera is disposed at a lower portion of the mirror head of the interior rearview mirror assembly, and wherein the occupant monitoring camera is disposed at an upper portion of the mirror head of the interior rearview mirror assembly.

8. The vehicular vision system of claim 1, wherein a video mirror display screen is disposed in the mirror head behind the mirror reflective element, and wherein, when the video mirror display screen is operated, video images displayed by the video mirror display screen are viewable through the mirror reflective element.

9. The vehicular vision system of claim 1, wherein a forward viewing camera is disposed at the in-cabin side of the windshield and at or near the mounting structure of the interior rearview mirror assembly.

10. The vehicular vision system of claim 1, further comprising an infrared thermometer operable to sense temperature in the cabin of the vehicle, wherein the ECU, responsive to an output of the infrared thermometer, determines a surface body temperature of an occupant of the vehicle, and wherein the ECU, responsive to the determined surface body temperature being greater than a threshold temperature, notifies the occupant of the vehicle of the determined surface body temperature.

11. The vehicular vision system of claim 10, wherein the ECU, responsive to processing at the ECU of image data captured by the occupant monitoring camera, detects the occupant of the vehicle in the second field of view of the occupant monitoring camera, and wherein the infrared thermometer senses temperature responsive to detection of the occupant of the vehicle.

12. The vehicular vision system of claim 10, wherein the infrared thermometer is disposed at the interior rearview mirror assembly.

13. The vehicular vision system of claim 1, wherein the electrochromic element is operable to selectively attenuate visible light while transmitting near infrared light therethrough.

14. A vehicular vision system comprising:
an electronic control unit (ECU) disposed at an interior rearview mirror assembly of a vehicle equipped with the vehicular vision system, wherein the ECU comprises electronic circuitry and associated software;
a rearward viewing camera disposed at a rear portion of the vehicle and having a first field of view at least rearward of the vehicle, wherein image data captured by the rearward viewing camera is provided to the ECU;
a forward viewing camera disposed at a windshield of the vehicle and having a second field of view through the windshield and at least forward of the vehicle, wherein image data captured by the forward viewing camera is provided to the ECU;
wherein the interior rearview mirror assembly includes a mirror head pivotally mounted at a mounting structure configured to attach at an in-cabin side of the windshield of the vehicle, and wherein the mirror head includes a mirror casing and a mirror reflective element;
wherein the mirror reflective element comprises a transflective mirror reflector;
a driver monitoring camera disposed at the mirror head of the interior rearview mirror assembly and viewing through the transflective mirror reflector of the mirror reflective element, wherein, with the mounting structure attached at the in-cabin side of the windshield of the vehicle, the driver monitoring camera has a third field of view of a driver region in a cabin of the vehicle, and wherein image data captured by the driver monitoring camera is provided to the ECU;
an occupant monitoring camera disposed at the mirror head of the interior rearview mirror assembly and viewing through the transflective mirror reflector of the mirror reflective element, wherein, with the mounting structure attached at the in-cabin side of the windshield of the vehicle, the occupant monitoring camera has a fourth field of view of an occupant region in the cabin of the vehicle that is different than the third field of view of the driver monitoring camera, and wherein image data captured by the occupant monitoring camera is provided to the ECU;
a video mirror display screen disposed at the mirror head of the interior rearview mirror assembly of the vehicle;
at least one near infrared light-emitting light emitting diode disposed at the interior rearview mirror assembly and operable to emit near infrared light, wherein, with the mounting structure attached at the in-cabin side of the windshield of the vehicle, the at least one near infrared light-emitting light emitting diode operates to emit near infrared light into the cabin of the vehicle at least when at least one selected from the group consisting of (i) the driver monitoring camera is activated and (ii) the occupant monitoring camera is activated;
wherein the driver monitoring camera and the occupant monitoring camera view through an electrochromic element, and wherein the electrochromic element comprises a transparent front glass substrate, a transparent rear glass substrate, and an electrochromic medium disposed between the transparent front glass substrate and the transparent rear glass substrate;
wherein the electrochromic element is electrically dimmable to attenuate visible light incident at the electrochromic element to reduce incidence of visible light at the driver monitoring camera and the occupant monitoring camera while allowing near infrared light to pass through the electrochromic element to be incident at the driver monitoring camera and the occupant monitoring camera;
wherein the electrochromic element is electrically dimmed at least in part responsive to operation of the at least one near infrared light-emitting light emitting diode;

wherein the electronic circuitry of the ECU comprises an image processor operable to process image data captured by at least the driver monitoring camera and the occupant monitoring camera;

wherein the video mirror display screen is operable to display video images derived from image data captured by the rearward viewing camera, and wherein, when the video mirror display screen is operated to display video images, video images displayed by the video mirror display screen are viewable through the transflective mirror reflector of the mirror reflective element;

wherein the ECU, via processing at the ECU of image data captured by the driver monitoring camera, determines attentiveness of a driver of the vehicle; and wherein image data captured by the forward viewing camera is processed to provide an output for a driving assistance system of the vehicle.

15. The vehicular vision system of claim 14, wherein the at least one near infrared light-emitting light emitting diode is operable to emit near infrared light into the cabin of the vehicle when the driver monitoring camera is activated.

16. The vehicular vision system of claim 14, wherein the at least one near infrared light-emitting light emitting diode is operable to emit near infrared light into the cabin of the vehicle when the occupant monitoring camera is activated.

* * * * *